United States Patent
Lu et al.

(10) Patent No.: US 12,199,171 B1
(45) Date of Patent: Jan. 14, 2025

(54) VERTICAL TUNNELING FIELD-EFFECT TRANSISTOR WITH ENHANCED CURRENT CONFINEMENT

(71) Applicant: National Technology & Engineering Solutions of Sandia, LLC, Albuquerque, NM (US)

(72) Inventors: Tzu-Ming Lu, Albuquerque, NM (US); Xujiao Gao, Albuquerque, NM (US); Evan Michael Anderson, Albuquerque, NM (US); Juan Pedro Mendez Granado, Albuquerque, NM (US); DeAnna Marie Campbell, Albuquerque, NM (US); Scott William Schmucker, Albuquerque, NM (US); Shashank Misra, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 405 days.

(21) Appl. No.: 17/830,874

(22) Filed: Jun. 2, 2022

Related U.S. Application Data (60) Provisional application No. 63/212,211, filed on Jun. 18, 2021.

(51) Int. Cl.
*H01L 29/66* (2006.01)
*H01L 21/02* (2006.01)
(Continued)

(52) U.S. Cl.
CPC .. *H01L 29/66977* (2013.01); *H01L 21/02057* (2013.01); *H01L 21/26513* (2013.01);
(Continued)

(58) Field of Classification Search
CPC ......... H01L 29/66977; H01L 21/02057; H01L 21/26513; H01L 21/3003; H01L 29/0847; H01L 29/66666; H01L 29/7827
(Continued)

(56) References Cited

U.S. PATENT DOCUMENTS 9,525,045 B1 * 12/2016 Lee .................. H01L 29/66734
11,424,135 B1 * 8/2022 Katzenmeyer ........ H01L 21/302
(Continued)

OTHER PUBLICATIONS

Koga, J. and Toriumi, A., "Negative Differential Conductance in Three-Terminal Silicon Tunneling Device," Applied Physics Letters, 1996, vol. 69, pp. 1435-1437.
(Continued)

*Primary Examiner* — Mohammad M Hoque
(74) *Attorney, Agent, or Firm* — Mark A. Dodd (57) ABSTRACT

A vertical tunneling field-effect transistor and a method for its manufacture are provided. According to methods herein disclosed, oppositely doped source and drain regions are formed, and an APAM delta layer is formed in the surface of the transistor substrate, beneath a metal gate, in electrical contact with, e.g., the source region. A dielectric layer intervenes between the substrate surface and the metal gate. An epitaxial cap layer directly over the APAM layer forms a dielectric layer interface with a dielectric layer, which is located between the epitaxial cap layer and the metal gate. A vertical channel is defined for tunneling between the APAM delta layer and an induced conduction channel adjacent to the dielectric layer interface that is formed in operation, and that is in electrical contact with, e.g., the drain region.

18 Claims, 7 Drawing Sheets

(51) Int. Cl.
*H01L 21/265* (2006.01)
*H01L 21/30* (2006.01)
*H01L 29/08* (2006.01)
*H01L 29/78* (2006.01)

(52) U.S. Cl.
CPC ...... *H01L 21/3003* (2013.01); *H01L 29/0847* (2013.01); *H01L 29/66666* (2013.01); *H01L 29/7827* (2013.01)

(58) Field of Classification Search
USPC .......................................................... 257/105
See application file for complete search history.

(56) References Cited

U.S. PATENT DOCUMENTS

| | | | |
|---|---|---|---|
| 11,798,808 B1 * | 10/2023 | Misra | H01L 21/28512 |
| 2008/0135878 A1 * | 6/2008 | Kim | H01L 29/78 257/E21.409 |

OTHER PUBLICATIONS

Lu H. and Seabaugh, A., "Tunnel Field-Effect Transistors: State-of-the-Art," Journal of the Electron Devices Society, 2014, vol. 2, pp. 44-49.

Lv, Y. et al., "Recent Advances in Low-Dimensional Heterojunction-Based Tunnel Field Effect Transistors," Advanced Electronic Materials, 2019, vol. 5, 1800569, 15 pages.

Ruess, F. J. et al., "Toward Atomic-Scale Device Fabrication in Silicon Using Scanning Probe Microscopy," Nano Letters, 2004, vol. 4, pp. 1969-1973.

Ward, D. R. et al., "All-Optical Lithography Process for Contacting Nanometer Precision Donor Devices," Applied Physics Letters, 2017, vol. 111, pp. 19310-1-19310-5.

Ward, D.R. et al., "Atomic Precision Advanced Manufacturing for Digital Electronics," Electronic Device Failure Analysis, 2020, vol. 22, pp. 4-10.

Anderson, E. M. et al., "Low Thermal Budget High-k/Metal Surface Gate for Buried Donor-Based Devices," Journal of Physics: Materials, 2020, vol. 3, 035002, 8 pages.

Mazzola, F. et al., "The Sub-Band Structure of Atomically Sharp Dopant Profiles in Silicon," Quantum Materials, 2020, vol. 34, pp. 1-5.

Lu, T-M. et al., "Path Towards Vertical Tunnel Field Effect Transistor Enabled by Atomic Precision Advanced Manufacturing," 2021, SAND2021-1204A, Sandia National Laboratories, Albuquerque, NM, 2 pages.

Hansch, W. et al., "A Vertical MOS-Gated Esaki Tunneling Transistor in Silicon," Thin Solid Films, 2000, vol. 369, pp. 387-389.

Kaarsberg, T. M. et al., "Manufacturing an Extremely Efficient Transistor for Decarbonization," 2021, https://www.aceee.org/sites/default/files/pdfs/ssi21/panel-2/Kaarsberg.pdf.

Teherani, J. T. et al., "Electrostatic Design of Vertical Tunneling Field-Effect Transistors," Proceedings 3rd Berkeley Symposium Energy Efficient Electronics Systems, Oct. 2013, pp. 1-2, University of California, Berkeley.

Avci, U. E. et al., "Energy Efficiency Comparison of Nanowire Heterojunction TFET and Si MOSFET at Lg=13nm, Including P-TFET and Variation Considerations," Proceedings IEEE Electron Devices, 2013, 4 pages.

Agarwal, S. and Yablonivitch, E, "Using Dimensionality to Achieve a Sharp Tunneling FET (TFET) Turn-On," Proceeding 69th Annual Device Research Conference (DRC), Santa Barbara, CA, USA, 2011, pp. 199-200.

Ionescu, A. M. and Heike, R., "Tunnel Field-Effect Transistors as Energy-Efficient Electronic Switches," Nature, 2011, vol. 479, pp. 329-337.

Seabaugh, A. "The Tunneling Transistor," IEEE Spectrum, 2013, pp. 35-62.

* cited by examiner

VERTICAL TUNNELING FIELD-EFFECT TRANSISTOR WITH ENHANCED CURRENT CONFINEMENT

RELATED APPLICATIONS

This application claims priority to U.S. Provisional Application No. 63/212,211, filed on Jun. 18, 2021, and entitled VERTICAL TUNNELING FIELD-EFFECT TRANSISTOR WITH ENHANCED CURRENT CONFINEMENT, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The invention relates to vertical tunneling field-effect transistors and to methods for their manufacture.

BACKGROUND

Conventional silicon MOSFETs are the fundamental building blocks for modern electronics. As MOSFETs continue to be scaled for ever-higher densities, however, the concomitant reductions in operating power and voltage are approaching fundamental physical limits. Designers in the field of semiconductor electronics have taken various approaches to overcoming this barrier. One such approach involves a device referred to as a tunneling field effect transistor (TFET).

The TFET was initially proposed as an energy-efficient alternative to the MOSFET. It resembles a MOSFET in some respects, but it operates by a different physical mechanism. In a MOSFET, p-n junctions create an energy barrier between the source and drain. The energy barrier is raised and lowered by an applied gate voltage. Current flows by thermionic emission from the source to the drain. Current switching is effectuated by raising and lowering the height of the energy barrier. In an n-channel MOSFET, the carriers are primarily electrons that flow within the conduction band. In a p-channel MOSFET, the carriers are primarily holes that flow within the valence band.

In a TFET, the source and drain regions are oppositely doped and separated by an intrinsic channel region. Unlike the MOSFET, the TFET has only a small difference in energy between the top of the valence band in the source region and the bottom of the conduction band in the channel region, or vice versa. In such an arrangement, the gate voltage can create an overlap in energy between the two bands. In an n-channel TFET, for example, a narrow energy barrier is created between the source region and a portion of the channel where the bottom of the conduction band has been pulled below the top of the valence band in the source region. Similarly, the narrow energy barrier in a p-channel TFET is created between the source region and a portion of the channel where the top of the valence band has been pulled above the bottom of the conduction band in the source region. In either case, the carrier transport is by quantum tunneling from source to drain through the energy barrier. The carrier transport is "band-to-band" because the carriers tunnel between the conduction and valence bands.

In principle, the charge transport mechanism in the TFET can overcome the thermodynamic limitations on the operating voltage and power of silicon MOSFETs. However, the practical performance of TFETs has generally been disappointing. In conventional TFET architectures, the p-doped and n-doped regions extend side-by-side, so that there is a linear, or essentially one-dimensional, junction region. The tunneling current scales with the linear extent of this region, i.e., with the junction width. The current-carrying ability of the TFET is limited, not only by low tunneling probabilities at achievable barrier thicknesses, but also by the low dimensionality of the junction region.

There have, in fact, been proposals to overcome these limitations by implementing a vertical geometry for the junction region. It has proven difficult, however, to provide tight spatial confinement of the electronic states in the vertical designs. The inhomogeneity due to poor confinement can prevent some parts of the device from fully turning off, while other parts of the device cannot fully turn on. It is believed that tight confinement in a vertical TFET geometry has been reported only for devices that incorporate two-dimensional materials.

Hence, there is still a need for further TFET designs that allow current to scale with the area of the device, and not merely with the junction width, so that higher current limits can be attained.

SUMMARY

The present invention relates to a new vertical TFET architecture that achieves two-dimensional confinement. A two-dimensional p-n junction allows the tunneling current to scale with the junction area, thus boosting the current limit of the device.

At the heart of the invention is a high-density delta layer buried under a silicon epitaxial layer. Fabrication of the delta layer is enabled by atomic precision advanced manufacturing (APAM) technology. APAM is an area-selective doping process in which a precursor molecule attaches only to reactive parts of the silicon surface. For example, a phosphine precursor can be used to chemically incorporate phosphorus into the silicon lattice in a tightly confined two-dimensional sheet at high density. Doping densities achieved in that manner can exceed the solid solubility limit.

As in conventional MOSFET designs, the APAM TFET has a gate stack in which a gate dielectric intervenes between a metal gate and a semiconductor. The p-n junction, however, is formed between an induced conduction channel in the semiconductor and the delta layer. In some embodiments, for example, the delta layer is an n-type layer that has been doped with phosphorus. In those embodiments, the induced conduction channel is a hole channel with a hole density that is controlled by the operating bias applied to the gate. The resulting vertical p-n junction allows two-dimensional band-to-band tunneling.

The present invention also relates to a process for fabricating the vertical APAM TFET. A silicon chip with an implanted source region is initially provided. In embodiments, the implanted source region is n-type. APAM methods are used to selectively pattern the delta layer with a suitable dopant; in illustrative embodiments, the dopant is phosphorus. Molecular beam epitaxy (MBE) is then used to cap the APAM delta layer with a layer of epitaxial silicon, i.e., an epitaxial cap layer, in which the induced conduction channel will form.

Conventional CMOS methods of microfabrication are then used to add the gate stack, and silicide-based contacts are incorporated for carrier injection.

The vertical APAM TFET with, e.g., a phosphorus-doped delta layer, may be regarded as a p-channel device, in the sense that the device turns ON when the gate pulls holes from the silicide drain region into a gate dielectric interface between the gate dielectric and the epitaxial cap layer. The band-to-band tunneling is controlled by suitable biasing of the source and drain regions in conjunction with the surface gate.

It is noteworthy that by using APAM techniques, carriers can be confined within a sheet only nanometers in thickness, and that with MBE, the gap of the tunnel junction can be controlled to nanometer scale.

In at least one embodiment of the present invention, an apparatus comprises a substrate having a surface, a first region doped to have a first type in a first portion of the substrate, a second region doped to have a second type opposite the first type (the second region in a second portion of the substrate different from the first portion), an APAM delta layer in electrical contact with one of the first region or the second region, an epitaxial cap layer directly on the APAM delta layer, a gate dielectric overlying the epitaxial cap layer (thereby forming a gate dielectric interface between the epitaxial cap layer and the gate dielectric), and a gate overlying the gate dielectric (the gate receiving an operating bias).

In other apparatuses, a vertical channel and an induced conduction channel are each adapted to form if the gate receives the operating bias (the vertical channel thereby permitting tunneling conduction in a direction perpendicular to the surface of the substrate, the tunneling conduction between the APAM delta layer and the induced conduction channel adjacent to the gate dielectric layer interface, the induced conduction channel in electrical contact with the other of the first region or the second region); the APAM delta layer is in electrical contact with the first region, and the induced conduction channel is in electrical contact with the second region; the first region is doped n-type (a corresponding n-type dopant includes one of phosphorous, arsenic, or antimony); the first region is doped p-type (a corresponding p-type dopant includes one of boron, aluminum, or gallium); the second region is a silicide (the silicide includes one of palladium, platinum, nickel, or cobalt); the APAM delta layer is doped n-type (a corresponding n-type dopant includes one of phosphorous or antimony); and the APAM delta layer is doped p-type (a corresponding p-type dopant includes one of boron, aluminum, or gallium).

In yet other apparatuses, the gate dielectric includes one of hafnium oxide or aluminum oxide; the gate includes one or more of titanium nitride, aluminum, tungsten, aluminum, titanium/gold, titanium/platinum, nickel silicide, cobalt silicide, titanium silicide, tungsten silicide, tantalum nitride, palladium silicide, platinum silicide, or heavily doped polycrystalline silicon; the apparatus further comprises a first contact in electrical contact with the first region and a second contact in electrical contact with the second region; each of the first contact and the second contact includes one or more of aluminum, titanium/gold, titanium/platinum, nickel silicide, cobalt silicide, titanium silicide, tungsten silicide, tantalum nitride, palladium silicide, or platinum silicide; and the first region is a source region and doped n-type, the second region is a drain region and doped p-type, and the APAM delta layer is doped n-type.

In at least one embodiment of the present invention, a method comprises forming a first region in a substrate having a surface, forming an APAM delta layer in the surface of the substrate (the APAM delta layer in electrical contact with the first region), growing an epitaxial cap layer directly on the APAM delta layer, depositing a gate dielectric over the APAM delta layer, depositing a gate over the gate dielectric, and forming a second region in the surface of the substrate by a process with a thermal budget that does not diffusively disrupt the APAM delta layer.

In other methods, forming the first region includes ion implantation and activation processes; forming the APAM delta layer includes cleaning the surface of the substrate, terminating the surface of the substrate with hydrogen, patterning the hydrogen terminated surface of the substrate, and exposing the patterned surface of the substrate to a dopant gas; the gate dielectric includes one of hafnium oxide or aluminum oxide; the gate includes one or more of titanium nitride, aluminum, tungsten, aluminum, titanium/gold, titanium/platinum, nickel silicide, cobalt silicide, titanium silicide, tungsten silicide, tantalum nitride, palladium silicide, platinum silicide, or heavily doped polycrystalline silicon; forming the second region includes depositing a silicide metal layer and annealing the substrate to thereby form the second region of a corresponding silicide; and the method further comprises forming a first contact in electrical contact with the first region and forming a second contact in electrical contact with the second region.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIG. 4A illustrates a transmission electron microscope (TEM) cross-sectional image of the gate stack of a related MIS capacitor with APAM processing in accordance with one or more embodiments of the present invention, while

DETAILED DESCRIPTION

Figure 1:
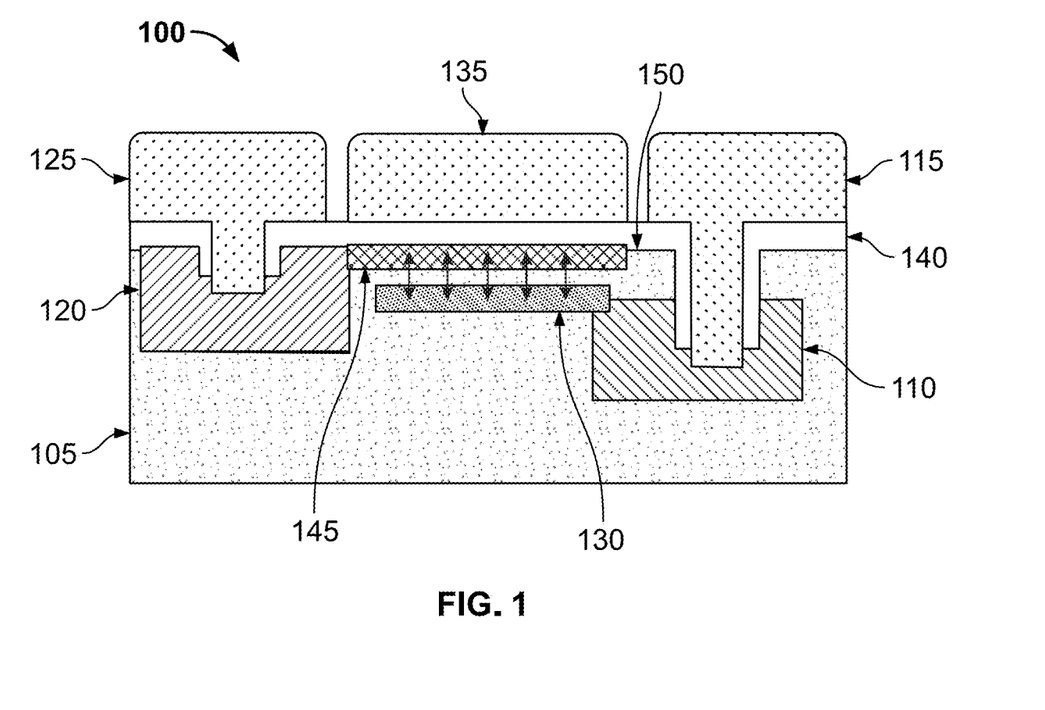
FIG. 1 is a simplified cross-sectional illustration of a vertical TFET made using APAM techniques in accordance with one or more embodiments of the present invention.

FIG. 1 is a simplified cross-sectional illustration of a vertical APAM TFET 100 made using APAM techniques in accordance with one or more embodiments. Formed in a substrate 105 are an n-type implanted source region 110 with a source contact 115 thereon, a p-type silicide drain region 120 with a drain contact 125 thereon, and an ultra-doped n-type APAM delta layer 130. A gate 135 is formed over a gate dielectric 140. An induced conduction channel 145, for transporting holes, forms in a silicon epitaxial cap layer 150 during operation of the illustrated vertical APAM TFET 100.

The fabrication of the vertical APAM TFET 100 offers several challenges. One challenge is that the defect density in the gate dielectric interface between the gate dielectric 140 and the epitaxial cap layer 150 must be low enough that the transconductance in the induced conduction channel 145 is not substantially degraded. Another challenge is that a low thermal budget is required to maintain a sufficiently sharp doping profile after the APAM patterning of the delta layer 130.

To confirm that fabricating a complete vertical APAM TFET would be feasible, a specially designed MIS capacitor was fabricated and experimentally tested. Although not an actual transistor, the MIS capacitor incorporated a gate stack similar to the gate stack that is a critical component of the vertical APAM TFET. Testing of the MIS capacitor allowed characterization of the behavior and functionality of a metal/dielectric gate stack in the new geometry where it is located on an APAM delta layer. These tests confirmed that the gate could accumulate a layer of holes above the buried APAM delta layer, thus demonstrating the fundamental mechanism that underlies the operation of an APAM TFET, for example, the vertical APAM TFET illustrated in FIG. 1.

The fabricated MIS capacitors included a phosphorus-doped APAM delta layer, referred to here as a "P:δ" layer. The substrate had an n+ handle and a 2-μm n-type ($1-5 \times 10^{14}$ cm$^{-3}$) Si (100) silicon epitaxial cap layer. Fabrication of the APAM part of the capacitor, including sample cleaning, P:δ layer doping, and silicon epitaxy, was made using the methods described in D. R. Ward et al., "All-optical lithography process for contacting nanometer precision donor devices," Applied Physics Letters, vol. 111, art. no. 193101 (2017), the contents of which are incorporated herein by reference.

Briefly, the samples are subjected to RCA1, RCA2, and HF cleans, and a 3 nm thick steam oxide is grown at approximately 750° C. to protect the samples. The oxidation process is followed by a 15 minute anneal at approximately 750° C. in nitrogen. If necessary, prior to insertion in the STM vacuum chamber, the samples are cleaned ex situ in an ultrasonic bath of acetone and isopropyl alcohol to remove remnant photoresist. An oxygen plasma clean at 100 W of power for 20 minutes removes most of the remaining hydrocarbon debris from the surface.

The samples are inserted into the STM vacuum chamber. In the STM vacuum chamber, the samples are degassed by heating them successively to approximately 450° C. for 20 minutes and then to approximately 600° C. for 40 minutes. Subsequently exposing the samples to atomic hydrogen, as described below, removes any remaining trace carbon on the surface.

A tungsten filament at approximately 1700° C. at a background pressure of $5 \times 10^{-6}$ Torr hydrogen gas generates atomic hydrogen while the sample is heated to approximately 600° C. for 20 minutes. The sample is then heated to remove the surface oxide. A typical heating time is in the range 60-80 minutes. Typical temperatures are in the range approximately 800° C. to approximately 1050° C. Finally, the sample surface is terminated with atomic hydrogen by using the same tungsten filament, but with a pressure of $2 \times 10^{-6}$ Torr hydrogen gas, while holding the sample between approximately 225° C. and approximately 325° C.

The hydrogen monolayer that terminates the sample surface constitutes the resist layer for the APAM process. This hydrogen resist can be removed at lower junction biases with atomic precision (~3-5 V, 10 nm/s tip speed) or more coarsely at higher biases (~7-10 V, 200 nm/s tip speed). The resultant exposed dangling bonds selectively adsorb a dopant gas, for example, phosphine, when it is introduced into the vacuum chamber.

A total phosphine dose of 15L is applied at a vacuum chamber pressure of $2 \times 10^{-8}$ Torr. A thermally activated surface decomposition reaction of the phosphine, at a temperature that leaves the hydrogen resist intact, results in P donors incorporated into the lattice at a density ranging between 17% for the smallest windows and 25% for large areas. The thermal incorporation of the P donors is performed in a temperature range from approximately 250° C. to approximately 350° C. for 10 minutes.

The device is then capped with a layer of epitaxial silicon, which is deposited at a rate in the range 0.5-1.0 nm/min to a thickness of 30 nm. Initially, 2 nm of epitaxial silicon is deposited near room temperature and annealed at approximately 400° C. to approximately 500° C. for fifteen seconds. The sample is then heated to approximately 250° C. to approximately 350° C., and the remainder of the 30-nm epitaxial cap layer is deposited at this elevated temperature.

To complete an MIS capacitor, the APAM-processed sample is subjected to a BOE dip and RCA2 clean to prepare the surface for gate dielectric deposition. The gate dielectric is formed by depositing 30 nm of ALD alumina at approximately 250° C., followed by a 15-minute anneal at approximately 300° C. in nitrogen. The sequence of metal layers in the gate consists of 5 nm TiN, 30 nm Al, and another 5 nm TiN, all deposited by sputtering.

Similar MIS capacitors, but without the APAM processing, were fabricated to provide a baseline device for comparison.

Comparative measurements of the C-V curves from the APAM and baseline MIS devices confirmed that the APAM device could accumulate holes and electrons at the gate dielectric interface, with sufficiently large operating biases. In particular, the accumulation of holes observed at negative voltages implies a gate-induced 2D hole layer sitting directly on top of the P:δ layer, as required for the vertical APAM TFET 100 illustrated in FIG. 1. The observed accumulation of holes also confirms that the quality of the epitaxial cap layer is high enough to permit TFET operation.

The fabrication of a fully functional vertical APAM TFET involves additional steps beyond those used to fabricate the MIS capacitor. Conventional CMOS processing proceeds in a sequence of steps performed at successively lower temperatures, so that the results of the thermal processing at each step are frozen in, relative to later steps. In general, APAM is thermally compatible as an intermediate process implemented between the high-temperature steps of so-called front-end-of-line (FEOL) manufacturing and the low-temperature steps of so-called back-end-of-line (BEOL) manufacturing.

Fabrication

Sequential stages in a process for fabricating the vertical APAM TFET are illustrated in FIGS. 2A-2D.

Figure 2A:
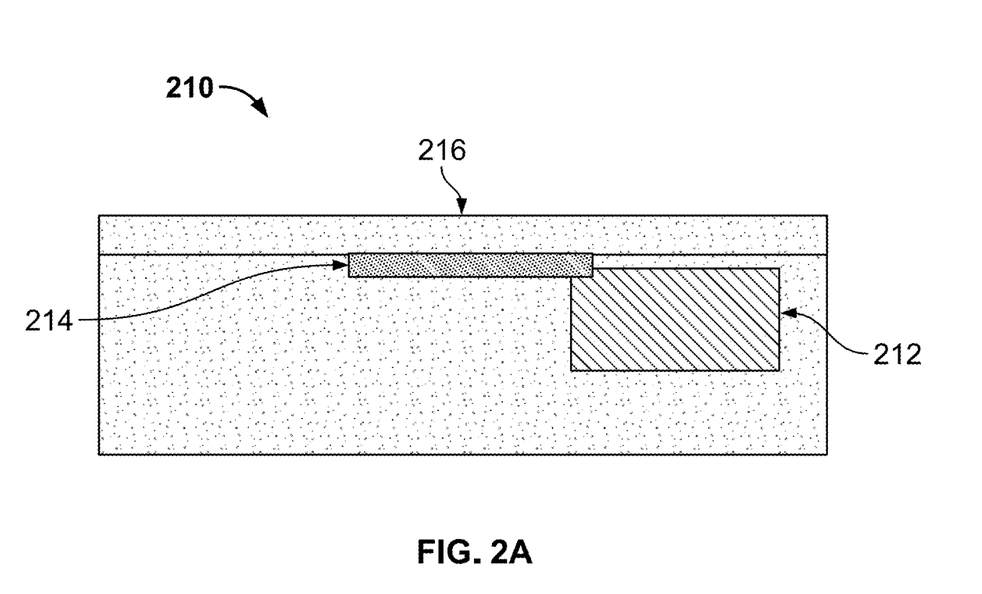
FIGS. 2A-2D illustrate the sequential stages in a process for fabricating an APAM TFET in accordance with one or more embodiments of the present invention.

At stage 210, illustrated in FIG. 2A, a high-temperature ion implantation and activation are performed on the substrate to define the source region 212. When the source region 212 is doped n-type, the ion implantation may employ group V elements, including, for example, phosphorus, arsenic, or antimony, while in other embodiments, when the source region is doped p-type, the ion implantation may employ group III elements, including, for example, boron, aluminum, or gallium. A delta layer 214 is then made, using an APAM process, with the delta layer 214 being in electrical contact with the source region 212. As discussed above, the delta layer 214 may be formed of phosphorous when an n-type delta layer 214 is desired. When phosphorous is used as the dopant, it may be deposited from, for example, a gaseous precursor of phosphine. Other possible n-type dopants include antimony. Antimony can be deposited, for example, via evaporation. In other embodiments, boron may be used as the dopant when a p-type delta layer 214 is desired. When boron is used as the dopant, it may be deposited from, for example, a gaseous precursor of boron trichloride or diborane. Other possible p-type dopants include aluminum and gallium. Aluminum can be deposited, for example, from aluminum trichloride, triethyl aluminum, or trimethyl aluminum.

The delta layer 214 is capped by growth of a silicon epitaxial cap layer 216. The epitaxial cap layer 216 must be thin enough to permit quantum tunneling between the delta layer 214 and the induced conduction channel. In example implementations, a thickness of 2-3 nm would be suitable for the epitaxial cap layer 216. It should be noted that this places the APAM process in the middle of the manufacturing process, at a moderate temperature.

Figure 2B:
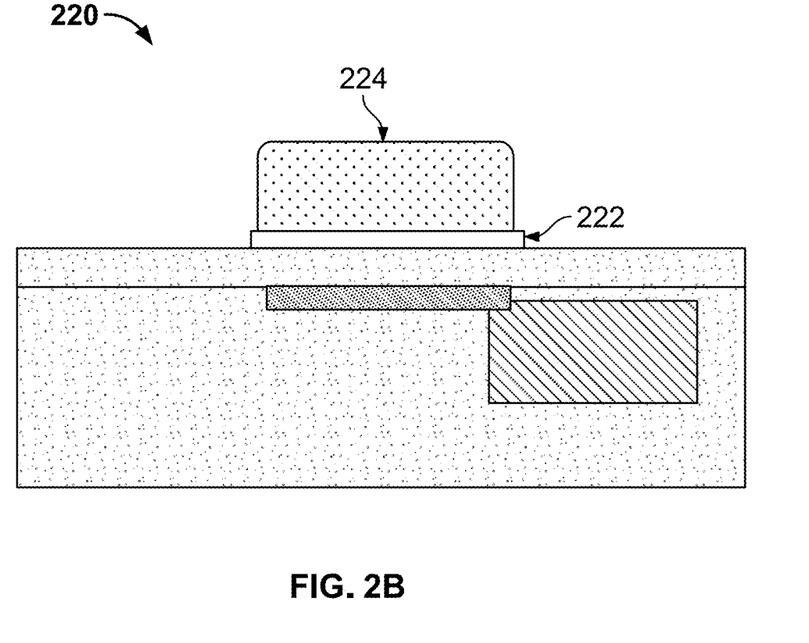

At stage 220, illustrated in FIG. 2B, and at lower temperatures, a high-k gate dielectric 222 and a metal gate 224 are deposited over the delta layer 214 and the epitaxial cap layer 216. The high-k gate dielectric 222 may be formed, for example, of hafnium oxide or aluminum oxide. The gate 224 may, as described above, be formed of a triple layer structure including TiN, Al, and TiN. In other embodiments, the gate 224 may be formed, for example, of tungsten, titanium/gold, titanium/platinum, nickel silicide, cobalt silicide, titanium silicide, tungsten silicide, tantalum nitride, palladium silicide, platinum silicide, or heavily doped (either n-type or p-type) polycrystalline silicon.

Figure 2C:
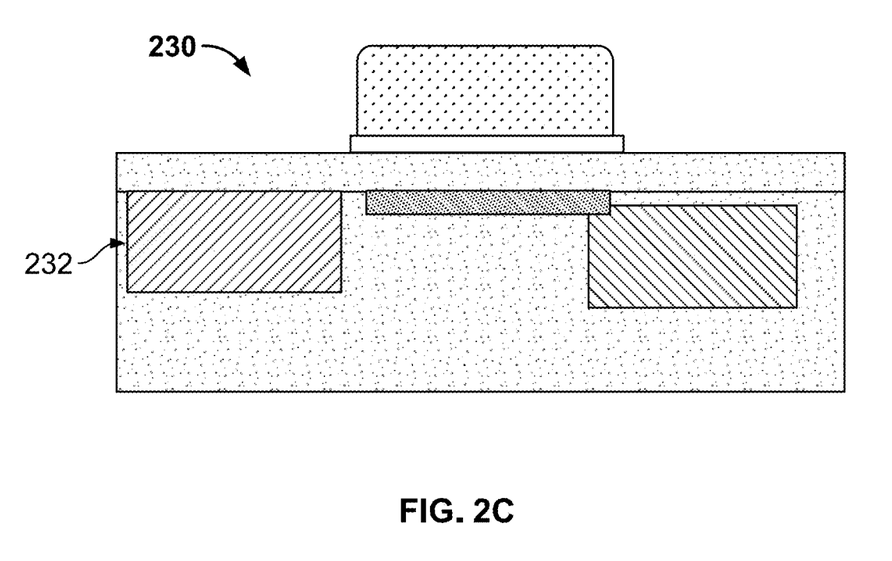

At stage 230, illustrated in FIG. 2C, a drain region 232 for the injection of holes into the induced conduction channel is formed of a silicide. It is important to form the drain region 232 by a process that does not thermally deactivate the delta layer 214 or disrupt it by diffusion.

The temperature threshold for disrupting the delta layer 214 is approximately 450° C., thus requiring a silicide with a low formation temperature. Examples are the silicides of palladium, platinum, nickel, and cobalt. However, it may be feasible, with suitable processing, to use silicides with higher formation temperatures. For example, a rapid thermal anneal (RTA) process may be able to mitigate the diffusive effects. Hence, no silicide of general interest in CMOS fabrication is categorically excluded.

Various silicides, including those formed with palladium, platinum, and nickel, were explored because these metals all form effective silicides at temperatures below the threshold temperature of approximately 450° C. For testing, a 200 Å thick layer of metal was deposited by e-beam evaporation. A series of RTA temperatures from approximately 250° C. to approximately 450° C. in increments of 50° C. were tested to assess the best contact operation. This RTA was performed in argon gas at atmospheric pressures for 15 minutes.

To form the silicide-based drain region 232 at stage 230 of the process, a film of a silicide metal suitable for silicide formation is deposited in the area where the drain region 232 is desired. The sample is annealed in a non-oxidizing environment. This drives the interdiffusion of the silicide metal and silicon atoms to form a thermodynamically stable phase of the silicide. The precise phase can be selected by adjusting both time and temperature, while these conditions will vary depending upon the selected silicide metal.

As those skilled in the art will appreciate, it may be advantageous, in alternative implementations, to use a self-aligned process for formation of the drain region 232.

Figure 2D:
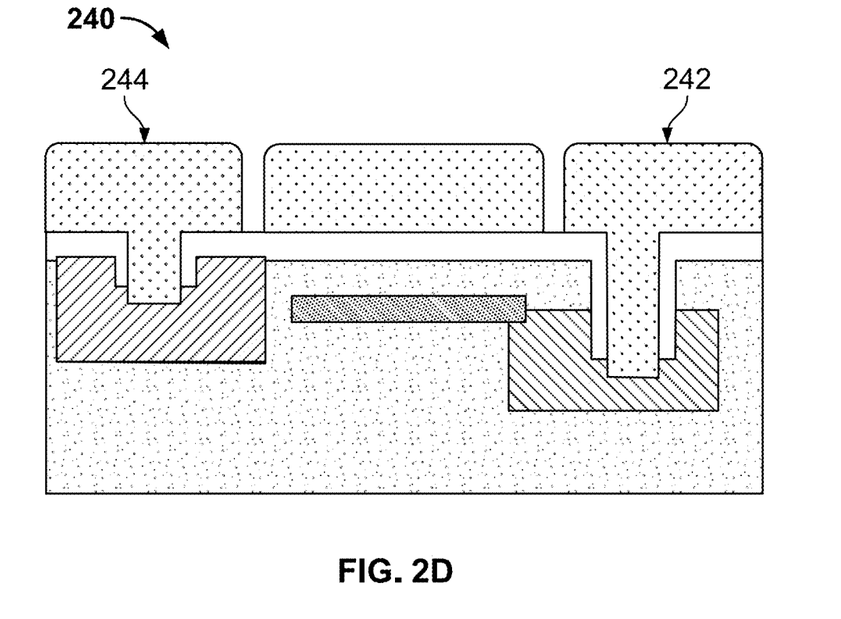

At stage 240, as illustrated in FIG. 2D, a source contact 242 and a drain contact 244 are formed. The source contact 242 is in electrical contact with the buried source region 212, but must be electrically isolated with respect to the remainder of the vertical APAM TFET structure. The drain contact 244 is in electrical contact with the silicide-based drain region 232. The source contact 242 and the drain contact 244 may be formed, for example, of aluminum, titanium/gold, titanium/platinum, nickel silicide, cobalt silicide, titanium silicide, tungsten silicide, tantalum nitride, palladium silicide, or platinum silicide.

While FIGS. 2A-2D correspond to a process flow for fabricating a vertical APAM TFET, the stages, or sub-stages, need not be undertaken in the illustrated order. In some embodiments, various stages, or sub-stages, may be undertaken simultaneously. In other embodiments, various stages, or sub-stages, may be undertaken in a different order than that illustrated in FIGS. 2A-2D. In still other embodiments, various stages, or sub-stages, may be omitted.

The above described process flow employed silicon CMOS compatible process steps. In other embodiments, the materials may be III-V, II-VI, or wide bandgap semiconductors with corresponding equivalent process steps.

EXAMPLES

Figure 3:
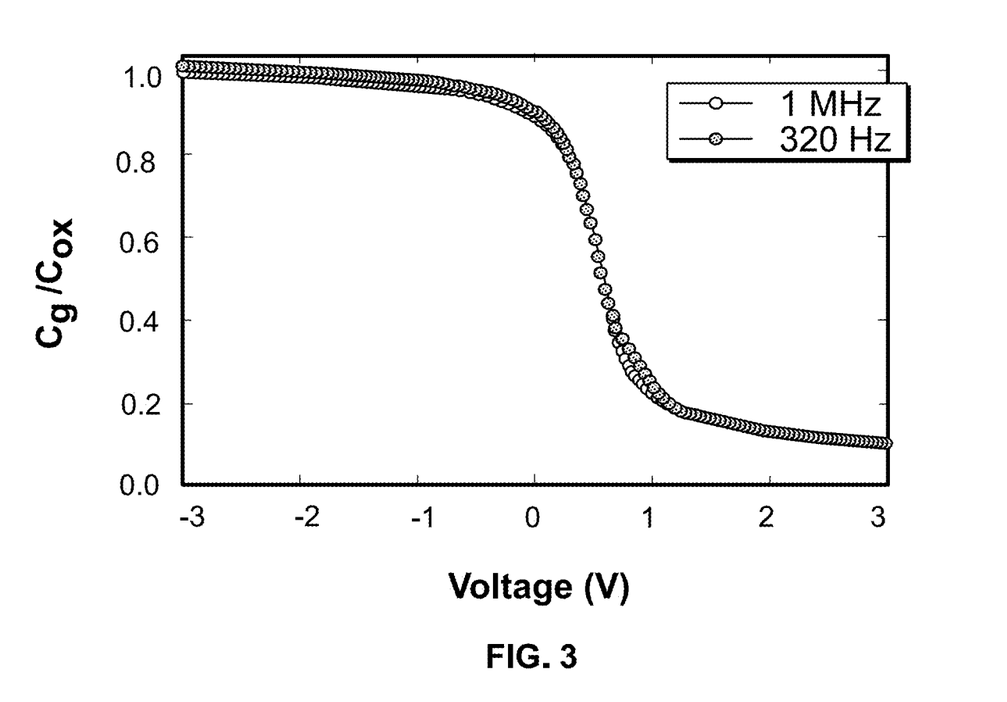
FIG. 3 is a plot of a capacitance-voltage (C-V) measurement, taken for comparative purposes, of a gate stack of a MIS capacitor that received no APAM processing.

MIS capacitors, as described above without any APAM processing, were fabricated and tested. Frequency dependent C-V measurements of the metal/oxide gate stack, as illustrated in FIG. 3, indicate an expected accumulation of interfacial holes, implying there are few defects. At negative bias, the capacitance is as expected. Frequency dispersion indicates that there is a low interfacial trap density of approximately $1.4 \times 10^{11}$ cm$^{-2}$ eV$^{-1}$.

Figure 4A:
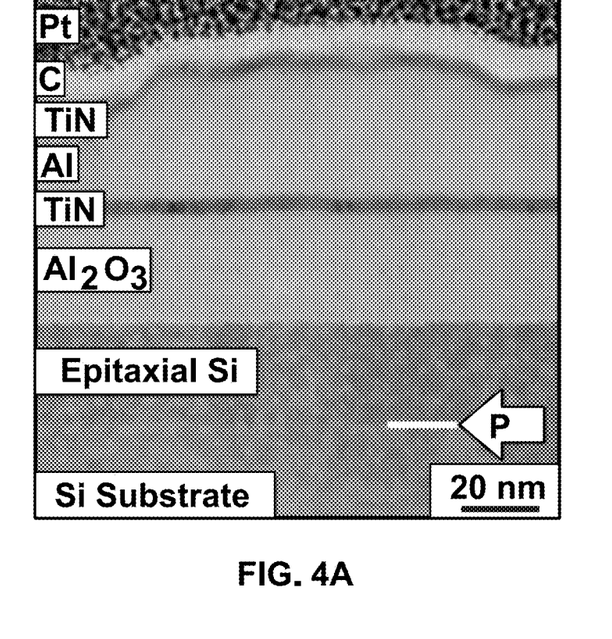

MIS capacitors, employing APAM P:δ layers as described above, were likewise fabricated and tested. A transmission electron microscope (TEM) cross-section of the metal/oxide gate stack, illustrated in FIG. 4A, confirms the quality of the layers. An arrow labeled with the letter "P" near the lower right-hand corner of the image indicates the position of the P:δ layer.

Figure 4B:
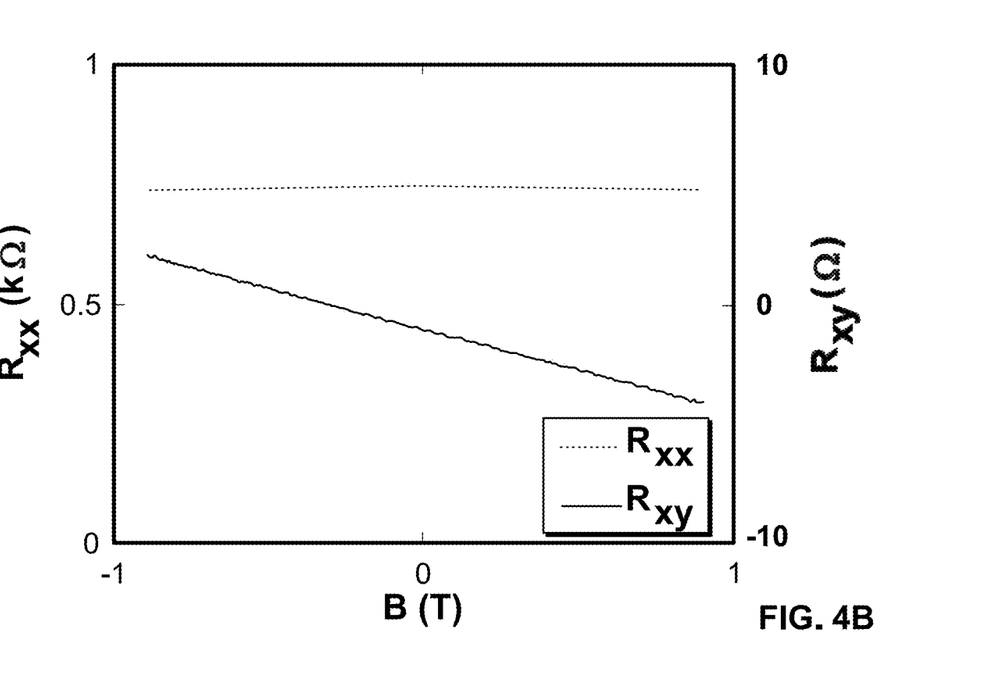
FIG. 4B is a plot of a Hall measurement of transport characteristics for a chip on which a related MIS capacitor was fabricated with APAM processing in accordance with one or more embodiments of the present invention.

FIG. 4B illustrates the longitudinal (upper curve) and transverse (lower curve) magneto-resistivity data at 4 K of a companion Hall bar device formed on the same chip. The carrier density and mobility extracted from the Hall measurement are $1.8 \times 10^{14}$ cm$^{-2}$ and 46 cm$^2$V$^{-1}$s$^{-1}$, both of which are consistent with typical P:δ layers. This consistency indicates that the ALD-grown gate dielectric and the gate layers do not alter the P:δ layer and are compatible with it.

Figure 5:
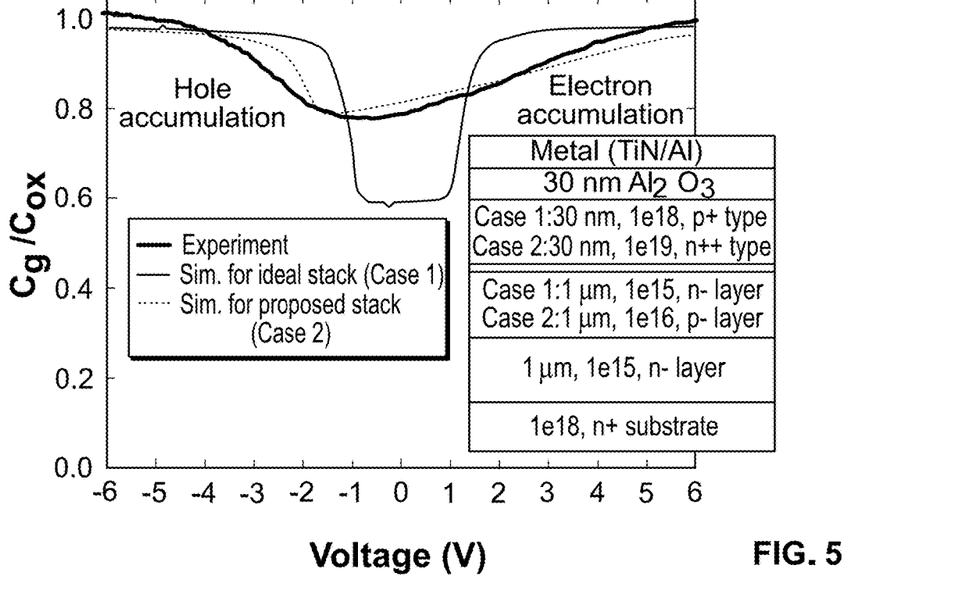
FIG. 5 shows an experimentally measured C-V curve of a related MIS capacitor fabricated with APAM processing in accordance with one or more embodiments of the present invention, together with simulated curves based on two different models of the layer structure of the capacitor stack.

Three C-V curves are illustrated in FIG. 5. The heavy black curve was experimentally measured. It was taken from a MIS capacitor fabricated on a P:δ layer at 1 KHz. As illustrated in the FIG. 5, this curve has a basin-like shape, with capacitance approaching the oxide capacitance at positive and negative biases. This indicates that accumulation of holes and electrons at the gate dielectric/epitaxial cap layer interface can be achieved at sufficiently large operating biases. The accumulation of holes at negative voltages implies that a gate-induced 2D hole layer sits directly on top of the P:δ layer, as required for operation of, for example, the vertical APAM TFET 100 illustrated in FIG. 1.

To facilitate a more detailed understanding of the experimental curve of FIG. 5, numerical simulations were undertaken of the DC C-V response of the stack of layers of the MIS capacitor under two hypothetical models, referred to as Case 1 and Case 2. The Case 1 result is plotted as the more symmetrical of the two theoretical curves in FIG. 5, i.e., as the curve having a flat minimum at 0V. The Case 2 result is plotted in FIG. 5 as the shallower and less symmetrical curve having a minimum near-1.5V.

The layer sequence for the hypothetical models consists of an n+ substrate at a carrier density of $1 \times 10^{18}$ cm$^{-3}$, a 1-μm n-type layer at a carrier density of $1 \times 10^{15}$ cm$^{-3}$, a 1-μm variable layer, the P:δ layer, a 30-nm variable silicon epitaxial cap layer, a 30-nm alumina gate dielectric, and the metal gate. The P:δ layer is approximated as a 5-nm-thick layer with n-type doping of $2 \times 10^{20}$ cm$^{-3}$.

Case 1 assumes the ideal layer structure. For Case 1, the 1-μm variable layer is n-type with a carrier density of $1 \times 10^{15}$ cm$^{-3}$, and the 30-nm variable silicon epitaxial cap layer is p-type with a carrier density of $1 \times 10^{18}$ cm$^{-3}$. For Case 2, the 1-μm variable layer is p-type with a carrier density of $1 \times 10^{16}$ cm$^{-3}$, and the 30-nm variable silicon epitaxial cap layer is heavily doped n-type with a carrier density of $1 \times 10^{19}$ cm$^{-3}$. These values are shown in the inset to FIG. 5.

As will be evident from FIG. 5, the Case 1 simulation differed substantially from the measured data. In particular, the simulated minimum capacitance was significantly smaller than the measured value. This suggests that unintentional doping effects from the APAM process caused the actual doping profile in the fabricated APAM gate stack to deviate from the designed doping profile.

Figure 6:
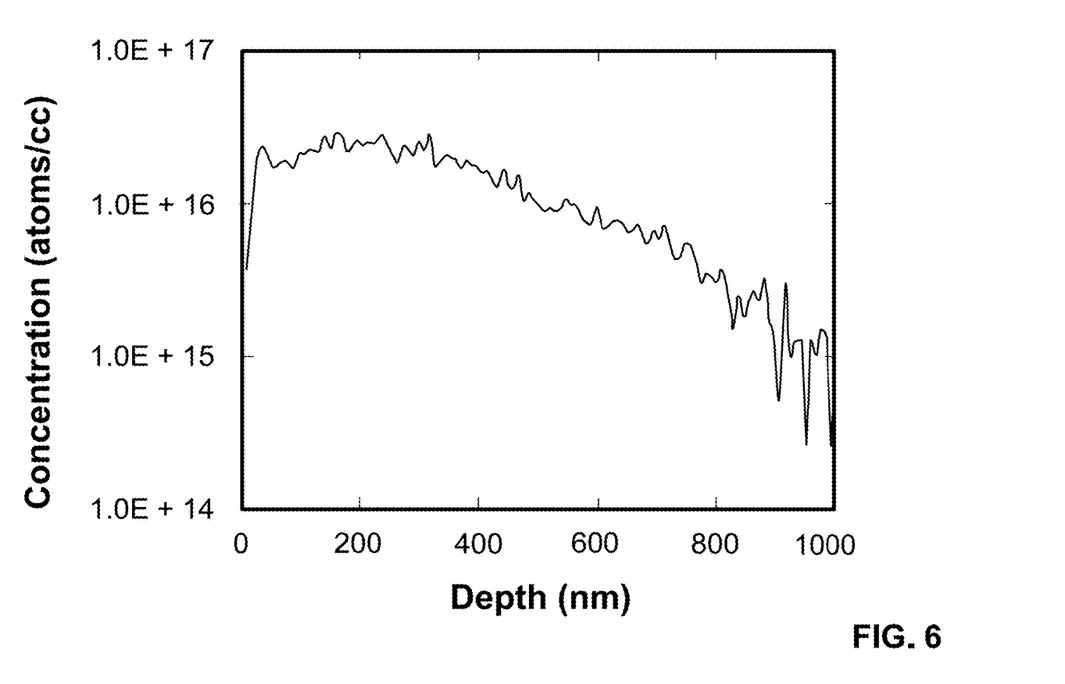
FIG. 6 is a depth profile, from secondary ion mass spectroscopy (SIMS), of the boron density from a chip subjected to part of the APAM process in accordance with one or more embodiments of the present invention.

FIG. 6 is a secondary ion mass spectrometry (SIMS) depth profile to examine a sample chip for unintentional doping that could have resulted from the APAM processing. The sample chip for the measurements of FIG. 6 had been subjected only to the high-temperature cleaning that is the first step of the APAM process. The sample chip had a boron background density of $10^{15}$ cm$^{-3}$.

The curve plotted in FIG. 6 indicates that a boron layer was unintentionally deposited on the surface and subsequently diffused into the sample. This degree of boron contamination is believed sufficient to convert the topmost 1 μm of the structure from n-type to p-type. It should also be noted in this regard that if the epitaxial growth of the silicon epitaxial cap layer is performed at too high a temperature, there can be diffusion from the P:δ layer into the 30-nm silicon epitaxial cap layer.

As illustrated in FIG. 5, the Case 2 simulation reproduces both the minimum capacitance and the low-frequency shape of the measured C-V curve. This was achieved by making the 1-μm variable layer p-type and making the 30-nm variable silicon epitaxial cap layer heavily n-type to account for the effects of the APAM sample cleaning and for partial diffusion of the P:δ layer. Adding a fixed, negative, interfacial charge density of $1.8 \times 10^{13}$ cm$^{-2}$ further shifted the minimum-capacitance voltage toward agreement with the measured value.

Figure 7:
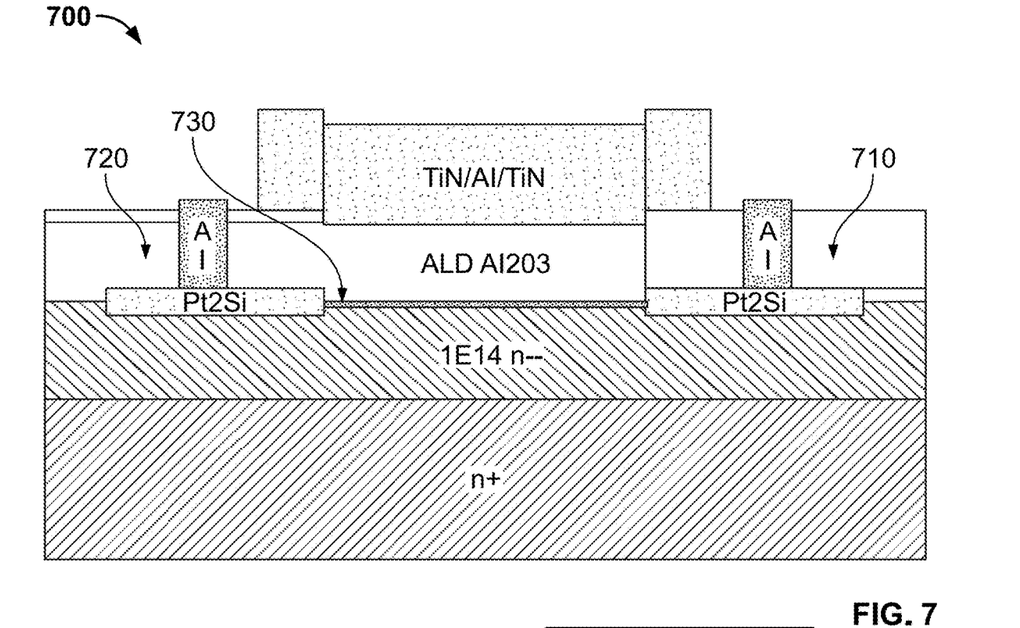
FIG. 7 is a simplified cross-sectional illustration of a related MISFET made using APAM processing in accordance with one or more embodiments of the present invention.
Figure 8A:
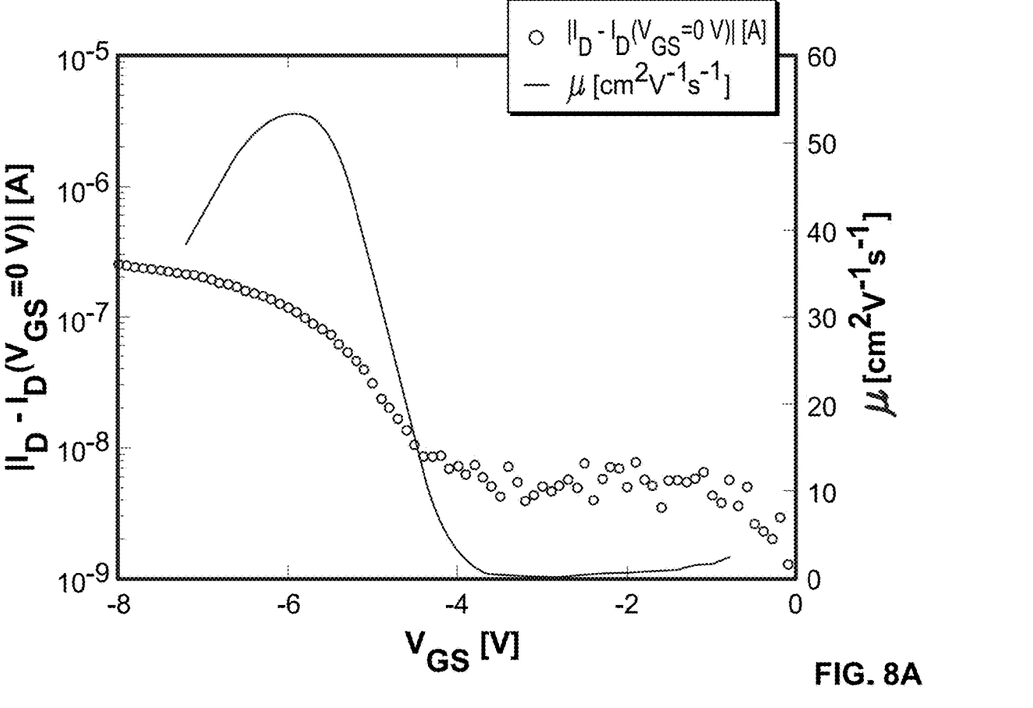
FIGS. 8A and 8B show experimentally measured results at drain to source biases of −0.1 V and −1.0 V, respectively, of a related MISFET.
Figure 8B:
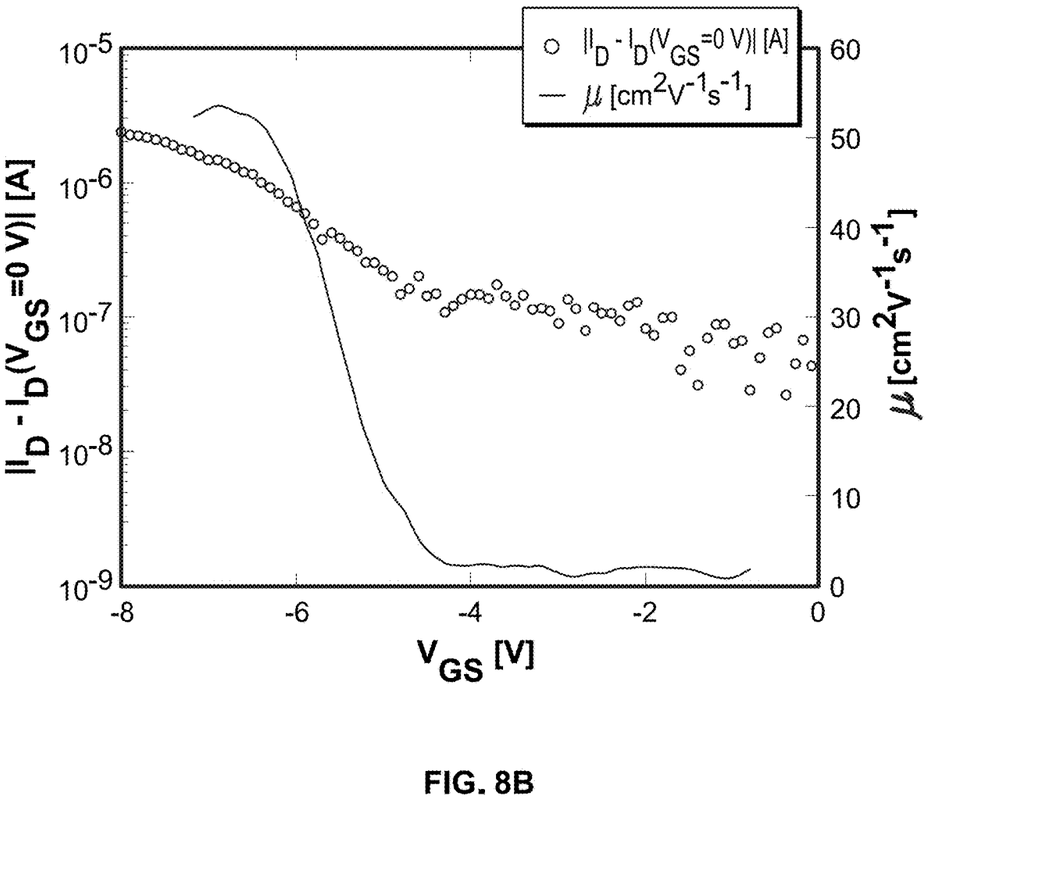

MISFETs, employing APAM P:δ layers as described above, were likewise fabricated and characterized. FIG. 7 illustrates a cross-sectional view of a MISFET 700. MISFET 700 differs from the above described vertical APAM TFET in that both the source region 710 and the drain region 720 are formed of silicides. The MISFET 700 allowed characterization of the transport properties of the APAM delta layer 730. The results of characterizing the MISFET 700 are illustrated in FIGS. 8A and 8B. FIG. 8A illustrates the results with a drain to source bias VDs of −0.1 V, while FIG. 8B illustrates the results with a VDs of −1.0 V. The left axes in FIGS. 8A and 8B correspond to the magnitude of the current through the APAM delta layer 730 at the test voltage minus the current through the APAM delta layer 730 at a gate to source bias $V_{GS}$=0 V. The right axes in FIGS. 8A and 8B correspond to the mobility u of carriers in the APAM delta layer 730. It is believed that the drop-off in mobility u is due to contact resistance. The subthreshold swing is high at ~1.5 V dec$^{-1}$, indicating the gate insulator or the corresponding interface needs improvement. The high gate leakage current and the threshold voltage $V_T$ of approximately −5V also suggest that the gate insulator needs improvement.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. An apparatus, comprising:
   a substrate having a surface;
   a first region doped to have a first type in a first portion of the substrate;
   a second region doped to have a second type opposite the first type, the second region in a second portion of the substrate different from the first portion;
   an APAM delta layer in electrical contact with one of the first region or the second region;
   an epitaxial cap layer directly on the APAM delta layer;
   a gate dielectric overlying the epitaxial cap layer, thereby forming a gate dielectric interface between the epitaxial cap layer and the gate dielectric; and
   a gate overlying the gate dielectric, the gate adapted to receive an operating bias.

2. The apparatus of claim 1, wherein a vertical channel and an induced conduction channel are each adapted to form if the gate receives the operating bias, the vertical channel thereby permitting tunneling conduction in a direction perpendicular to the surface of the substrate, the tunneling conduction between the APAM delta layer and the induced conduction channel adjacent to the gate dielectric layer interface, the induced conduction channel in electrical contact with the other of the first region or the second region.

3. The apparatus of claim 2, wherein the APAM delta layer is in electrical contact with the first region, and the induced conduction channel is in electrical contact with the second region.

4. The apparatus of claim 1,
wherein the first region is doped n-type; and
wherein a corresponding n-type dopant includes one of phosphorous, arsenic, or antimony.

5. The apparatus of claim 1,
wherein the first region is doped p-type; and
wherein a corresponding p-type dopant includes one of boron, aluminum, or gallium.

6. The apparatus of claim 1,
wherein the second region is a silicide; and
wherein the silicide includes one of palladium, platinum, nickel, or cobalt.

7. The apparatus of claim 1,
wherein the APAM delta layer is doped n-type; and
wherein a corresponding n-type dopant includes one of phosphorous or antimony.

8. The apparatus of claim 1,
wherein the APAM delta layer is doped p-type; and
wherein a corresponding p-type dopant includes one of boron, aluminum, or gallium.

9. The apparatus of claim 1, wherein the gate dielectric includes one of hafnium oxide or aluminum oxide.

10. The apparatus of claim 1, wherein the gate includes one or more of titanium nitride, aluminum, tungsten, aluminum, titanium/gold, titanium/platinum, nickel silicide, cobalt silicide, titanium silicide, tungsten silicide, tantalum nitride, palladium silicide, platinum silicide, or heavily doped polycrystalline silicon.

11. The apparatus of claim 1, further comprising:
a first contact in electrical contact with the first region; and
a second contact in electrical contact with the second region.

12. The apparatus of claim 11, wherein each of the first contact and the second contact includes one or more of aluminum, titanium/gold, titanium/platinum, nickel silicide, cobalt silicide, titanium silicide, tungsten silicide, tantalum nitride, palladium silicide, or platinum silicide.

13. The apparatus of claim 1,
wherein the first region is a source region and doped n-type;
wherein the second region is a drain region and doped p-type; and
wherein the APAM delta layer is doped n-type.

14. The apparatus of claim 1, wherein the substrate includes silicon.

15. The apparatus of claim 11, wherein the gate dielectric is adapted to electrically isolate each of the first contact and the second contact.

16. The apparatus of claim 1, wherein the APAM delta layer is approximately 5 nm thick.

17. The apparatus of claim 1, wherein the APAM delta layer has a doping density of approximately $2\times10^{20}$ cm$^{-3}$.

18. The apparatus of claim 1, wherein the epitaxial cap layer includes silicon.

* * * * *